United States Patent
Fitzpatrick et al.

(10) Patent No.: US 9,543,025 B2
(45) Date of Patent: Jan. 10, 2017

(54) STORAGE CONTROL SYSTEM WITH POWER-OFF TIME ESTIMATION MECHANISM AND METHOD OF OPERATION THEREOF

(71) Applicant: SMART Storage Systems, Inc., Chandler, AZ (US)

(72) Inventors: James Fitzpatrick, Sudbury, MA (US); James M. Higgins, Chandler, AZ (US); Bernardo Rub, Sudbury, MA (US); Ryan Jones, Mesa, AZ (US); Robert W. Ellis, Phoenix, AZ (US); Mark Dancho, Chandler, AZ (US); Sheunghee Park, Pleasanton, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 13/861,326

(22) Filed: Apr. 11, 2013

(65) Prior Publication Data
US 2014/0310445 A1  Oct. 16, 2014

(51) Int. Cl.
| | | |
|---|---|---|
| G06F 12/00 | (2006.01) | |
| G11C 16/20 | (2006.01) | |
| G06F 12/02 | (2006.01) | |
| G11C 16/34 | (2006.01) | |

(52) U.S. Cl.
CPC .......... *G11C 16/20* (2013.01); *G06F 12/0246* (2013.01); *G11C 16/349* (2013.01); *G11C 16/3418* (2013.01)

(58) Field of Classification Search
None
See application file for complete search history.

(56) References Cited

U.S. PATENT DOCUMENTS

| | | | |
|---|---|---|---|
| 4,048,481 A | 9/1977 | Bailey, Jr. et al. | |
| 4,839,587 A | 6/1989 | Flatley et al. | |
| 5,034,744 A | 7/1991 | Obinata | |
| 5,210,854 A | 5/1993 | Beaverton et al. | |

(Continued)

FOREIGN PATENT DOCUMENTS

| | | |
|---|---|---|
| EP | 1 956 489 A2 | 8/2008 |
| EP | 1 990 921 A2 | 11/2008 |

(Continued)

OTHER PUBLICATIONS

Tseng et.al "Understanding the Impact of Power Loss on Flash Memory" ACM 2011.*

(Continued)

*Primary Examiner* — Yong Choe
*Assistant Examiner* — Tasnima Matin
(74) *Attorney, Agent, or Firm* — Morgan, Lewis & Bockius LLP

(57) ABSTRACT

A storage control system, and a method of operation thereof, including: a power-down module for powering off a memory sub-system; a decay estimation module, coupled to the power-down module, for estimating a power-off decay rate upon the memory sub-system powered up, the power-off decay rate is for indicating how much data in the memory sub-system has decayed while the memory sub-system has been powered down; and a recycle module, coupled to the decay estimation module, for recycling an erase block for data retention based on the power-off decay rate.

16 Claims, 8 Drawing Sheets

(56) References Cited

U.S. PATENT DOCUMENTS

| | | |
|---|---|---|
| 5,311,395 A | 5/1994 | McGaha et al. |
| 5,450,354 A * | 9/1995 | Sawada et al. .......... 365/185.24 |
| 5,479,638 A | 12/1995 | Assar et al. |
| 5,784,174 A * | 7/1998 | Fujino et al. ................ 358/404 |
| 5,790,828 A | 8/1998 | Jost |
| 5,930,504 A | 7/1999 | Gabel |
| 5,949,785 A | 9/1999 | Beasley |
| 5,963,983 A | 10/1999 | Sakakura et al. |
| 6,034,897 A | 3/2000 | Estakhri et al. |
| 6,069,827 A | 5/2000 | Sinclair |
| 6,091,652 A | 7/2000 | Haehn et al. |
| 6,275,436 B1 | 8/2001 | Tobita et al. |
| 6,345,367 B1 | 2/2002 | Sinclair |
| 6,356,447 B2 | 3/2002 | Scafidi |
| 6,381,176 B1 | 4/2002 | Kim et al. |
| 6,381,670 B1 | 4/2002 | Lee et al. |
| 6,529,997 B1 | 3/2003 | Debiez et al. |
| 6,552,581 B1 | 4/2003 | Gabara |
| 6,587,915 B1 | 7/2003 | Kim |
| 6,618,249 B2 | 9/2003 | Fairchild |
| 6,661,503 B1 | 12/2003 | Yamaguchi et al. |
| 6,728,913 B1 | 4/2004 | Parker |
| 6,763,424 B2 | 7/2004 | Conley |
| 6,775,792 B2 | 8/2004 | Ulrich et al. |
| 6,778,387 B2 | 8/2004 | Fairchild |
| 6,850,443 B2 | 2/2005 | Lofgren et al. |
| 6,854,070 B2 | 2/2005 | Johnson et al. |
| 6,871,304 B2 | 3/2005 | Hadjihassan et al. |
| 6,903,972 B2 | 6/2005 | Lasser et al. |
| 6,906,961 B2 | 6/2005 | Eggleston et al. |
| 6,975,028 B1 | 12/2005 | Wayburn et al. |
| 7,082,495 B2 | 7/2006 | DeWhitt et al. |
| 7,107,389 B2 | 9/2006 | Inagaki et al. |
| 7,139,864 B2 | 11/2006 | Bennett et al. |
| 7,233,497 B2 | 6/2007 | Simon et al. |
| 7,243,186 B2 | 7/2007 | Liang et al. |
| 7,298,888 B2 | 11/2007 | Hamar |
| 7,330,927 B1 | 2/2008 | Reeve et al. |
| 7,333,364 B2 | 2/2008 | Yu et al. |
| 7,350,101 B1 | 3/2008 | Nguyen et al. |
| 7,355,896 B2 | 4/2008 | Li et al. |
| 7,434,122 B2 | 10/2008 | Jo |
| 7,441,067 B2 | 10/2008 | Gorobets et al. |
| 7,516,267 B2 | 4/2009 | Coulson et al. |
| 7,558,109 B2 | 7/2009 | Brandman et al. |
| 7,613,871 B2 | 11/2009 | Tanaka et al. |
| 7,620,710 B2 | 11/2009 | Kottomtharayil et al. |
| 7,620,769 B2 | 11/2009 | Lee et al. |
| 7,639,532 B2 | 12/2009 | Roohparvar et al. |
| 7,661,054 B2 | 2/2010 | Huffman et al. |
| 7,679,948 B2 | 3/2010 | Park et al. |
| 7,693,422 B2 | 4/2010 | Alicherry et al. |
| 7,738,502 B2 | 6/2010 | Chang et al. |
| 7,743,216 B2 | 6/2010 | Lubbers et al. |
| 7,818,525 B1 | 10/2010 | Frost et al. |
| 7,827,348 B2 | 11/2010 | Lee et al. |
| 7,830,164 B2 | 11/2010 | Earle et al. |
| 7,853,749 B2 | 12/2010 | Kolokowsky |
| 7,979,614 B1 | 7/2011 | Yang |
| 8,000,161 B2 | 8/2011 | Stan et al. |
| 8,001,135 B2 | 8/2011 | Perlmutter et al. |
| 8,010,738 B1 | 8/2011 | Chilton et al. |
| 8,028,123 B2 | 9/2011 | Kilzer et al. |
| 8,046,645 B2 | 10/2011 | Hsu et al. |
| 8,051,241 B2 | 11/2011 | Feldman et al. |
| 8,072,805 B2 | 12/2011 | Chou et al. |
| 8,095,724 B2 | 1/2012 | Ji et al. |
| 8,095,765 B2 | 1/2012 | Asnaashari et al. |
| 8,117,396 B1 | 2/2012 | Fair et al. |
| 8,127,202 B2 | 2/2012 | Cornwell et al. |
| 8,145,984 B2 | 3/2012 | Sommer et al. |
| 8,154,921 B2 | 4/2012 | Mokhlesi et al. |
| 8,169,825 B1 * | 5/2012 | Shalvi et al. ........... 365/185.09 |
| 8,205,028 B1 | 6/2012 | Sakarda |
| 8,209,677 B2 | 6/2012 | Shintani et al. |
| 8,219,724 B1 | 7/2012 | Caruso et al. |
| 8,219,776 B2 | 7/2012 | Forhan et al. |
| 8,228,701 B2 | 7/2012 | Sokolov et al. |
| 8,245,101 B2 | 8/2012 | Olbrich et al. |
| 8,250,621 B2 | 8/2012 | Cha |
| 8,254,172 B1 | 8/2012 | Kan |
| 8,259,506 B1 | 9/2012 | Sommer et al. |
| 8,289,801 B2 | 10/2012 | Smith et al. |
| 8,296,534 B1 | 10/2012 | Gupta et al. |
| 8,332,578 B2 | 12/2012 | Frickey, III et al. |
| 8,363,413 B2 | 1/2013 | Paquette et al. |
| 8,369,141 B2 | 2/2013 | Sommer et al. |
| 8,386,700 B2 | 2/2013 | Olbrich et al. |
| 8,386,860 B2 | 2/2013 | Tseng et al. |
| 8,397,101 B2 | 3/2013 | Goss et al. |
| 8,407,409 B2 | 3/2013 | Kawaguchi |
| 8,464,106 B2 | 6/2013 | Filor et al. |
| 8,503,238 B1 | 8/2013 | Wu et al. |
| 8,521,981 B2 | 8/2013 | Strauss et al. |
| 8,560,770 B2 | 10/2013 | Haines et al. |
| 8,601,203 B2 | 12/2013 | Holbrook et al. |
| 8,612,669 B1 * | 12/2013 | Syu et al. ................. 711/103 |
| 8,612,804 B1 | 12/2013 | Kang et al. |
| 8,661,184 B2 | 2/2014 | Wood et al. |
| 8,694,811 B2 | 4/2014 | Raju et al. |
| 8,725,931 B1 | 5/2014 | Kang |
| 8,750,052 B2 | 6/2014 | Aoki et al. |
| 8,793,556 B1 | 7/2014 | Northcott et al. |
| 8,799,747 B2 | 8/2014 | Goss et al. |
| 8,832,506 B2 | 9/2014 | Griffin et al. |
| 8,862,818 B1 | 10/2014 | Ozdemir |
| 8,880,838 B2 | 11/2014 | Kaiser et al. |
| 8,984,216 B2 | 3/2015 | Fillingim |
| 9,043,668 B2 | 5/2015 | Goss et al. |
| 9,063,844 B2 | 6/2015 | Higgins et al. |
| 9,069,468 B2 | 6/2015 | Mehra et al. |
| 9,116,401 B2 | 8/2015 | Kim et al. |
| 9,201,728 B2 | 12/2015 | Patapoutian et al. |
| 9,239,781 B2 | 1/2016 | Jones et al. |
| 2002/0056025 A1 | 5/2002 | Qiu et al. |
| 2002/0156891 A1 | 10/2002 | Ulrich et al. |
| 2002/0159285 A1 | 10/2002 | Morley et al. |
| 2003/0033308 A1 | 2/2003 | Patel et al. |
| 2003/0046603 A1 | 3/2003 | Harari et al. |
| 2003/0074592 A1 | 4/2003 | Hasegawa |
| 2003/0163633 A1 | 8/2003 | Aasheim et al. |
| 2004/0080985 A1 | 4/2004 | Chang et al. |
| 2004/0088511 A1 | 5/2004 | Bacon et al. |
| 2004/0252670 A1 | 12/2004 | Rong et al. |
| 2005/0021904 A1 | 1/2005 | Iaculo et al. |
| 2005/0038792 A1 | 2/2005 | Johnson |
| 2005/0073884 A1 | 4/2005 | Gonzalez et al. |
| 2005/0076102 A1 | 4/2005 | Chen et al. |
| 2005/0144516 A1 | 6/2005 | Gonzalez et al. |
| 2006/0015683 A1 | 1/2006 | Ashmore et al. |
| 2006/0020745 A1 | 1/2006 | Conley et al. |
| 2006/0022054 A1 | 2/2006 | Elhamias et al. |
| 2006/0080505 A1 | 4/2006 | Arai et al. |
| 2006/0136682 A1 | 6/2006 | Haridas et al. |
| 2006/0143365 A1 | 6/2006 | Kikuchi |
| 2006/0143475 A1 | 6/2006 | Herbert et al. |
| 2006/0253641 A1 | 11/2006 | Gatzemeier et al. |
| 2006/0256624 A1 | 11/2006 | Eggleston et al. |
| 2006/0282644 A1 | 12/2006 | Wong |
| 2006/0294574 A1 | 12/2006 | Cha |
| 2007/0050536 A1 | 3/2007 | Kolokowsky |
| 2007/0061511 A1 | 3/2007 | Faber |
| 2007/0067598 A1 | 3/2007 | Fujimoto |
| 2007/0079152 A1 | 4/2007 | Winick et al. |
| 2007/0083779 A1 | 4/2007 | Misaka et al. |
| 2007/0226592 A1 * | 9/2007 | Radke ........................ 714/766 |
| 2007/0234004 A1 | 10/2007 | Oshima et al. |
| 2007/0260811 A1 | 11/2007 | Merry, Jr. et al. |
| 2007/0263444 A1 | 11/2007 | Gorobets et al. |
| 2007/0276973 A1 | 11/2007 | Tan et al. |
| 2008/0028246 A1 | 1/2008 | Witham |
| 2008/0046630 A1 | 2/2008 | Lasser |
| 2008/0052446 A1 | 2/2008 | Lasser et al. |
| 2008/0082736 A1 | 4/2008 | Chow et al. |

(56) References Cited

U.S. PATENT DOCUMENTS

| | | |
|---|---|---|
| 2008/0126720 A1 | 5/2008 | Danilak |
| 2008/0183918 A1 | 7/2008 | Dhokia et al. |
| 2008/0189588 A1* | 8/2008 | Tanaka et al. ............... 714/764 |
| 2008/0263289 A1 | 10/2008 | Hosoya et al. |
| 2008/0313505 A1 | 12/2008 | Lee et al. |
| 2009/0006900 A1* | 1/2009 | Lastras-Montano et al. .. 714/42 |
| 2009/0019321 A1 | 1/2009 | Radke |
| 2009/0070651 A1* | 3/2009 | Diggs et al. ................ 714/752 |
| 2009/0083587 A1 | 3/2009 | Ng et al. |
| 2009/0089485 A1 | 4/2009 | Yeh |
| 2009/0091990 A1 | 4/2009 | Park et al. |
| 2009/0109786 A1* | 4/2009 | Ye et al. ...................... 365/228 |
| 2009/0125670 A1 | 5/2009 | Keays |
| 2009/0132756 A1 | 5/2009 | Hsieh |
| 2009/0138654 A1 | 5/2009 | Sutardja |
| 2009/0146721 A1 | 6/2009 | Kurooka et al. |
| 2009/0157948 A1 | 6/2009 | Trichina et al. |
| 2009/0164702 A1 | 6/2009 | Kern |
| 2009/0164710 A1* | 6/2009 | Choi et al. .................... 711/103 |
| 2009/0172248 A1 | 7/2009 | You |
| 2009/0172262 A1 | 7/2009 | Olbrich et al. |
| 2009/0179707 A1 | 7/2009 | Higashino |
| 2009/0183183 A1 | 7/2009 | Muppirala et al. |
| 2009/0228634 A1* | 9/2009 | Nakamura et al. ........... 711/103 |
| 2009/0228761 A1 | 9/2009 | Perlmutter et al. |
| 2009/0259819 A1 | 10/2009 | Chen et al. |
| 2009/0259896 A1 | 10/2009 | Hsu et al. |
| 2009/0271562 A1 | 10/2009 | Sinclair |
| 2009/0287975 A1 | 11/2009 | Kim et al. |
| 2009/0300238 A1 | 12/2009 | Panabaker et al. |
| 2009/0323419 A1 | 12/2009 | Lee et al. |
| 2009/0327581 A1 | 12/2009 | Coulson |
| 2009/0327591 A1 | 12/2009 | Moshayedi |
| 2010/0017650 A1 | 1/2010 | Chin et al. |
| 2010/0023674 A1 | 1/2010 | Aviles |
| 2010/0050053 A1 | 2/2010 | Wilson et al. |
| 2010/0082890 A1 | 4/2010 | Heo et al. |
| 2010/0122019 A1 | 5/2010 | Flynn et al. |
| 2010/0128537 A1 | 5/2010 | Suhail et al. |
| 2010/0138592 A1 | 6/2010 | Cheon |
| 2010/0165689 A1 | 7/2010 | Rotbard et al. |
| 2010/0169541 A1 | 7/2010 | Freikorn |
| 2010/0172179 A1 | 7/2010 | Gorobets et al. |
| 2010/0174845 A1 | 7/2010 | Gorobets et al. |
| 2010/0217898 A1 | 8/2010 | Priborsky et al. |
| 2010/0217915 A1 | 8/2010 | O'Connor et al. |
| 2010/0223531 A1 | 9/2010 | Fukutomi et al. |
| 2010/0228928 A1 | 9/2010 | Asnaashari et al. |
| 2010/0262792 A1 | 10/2010 | Hetzler et al. |
| 2010/0262795 A1 | 10/2010 | Hetzler et al. |
| 2010/0262875 A1 | 10/2010 | Hetzler et al. |
| 2010/0287328 A1 | 11/2010 | Feldman et al. |
| 2010/0293367 A1 | 11/2010 | Berke et al. |
| 2010/0312954 A1 | 12/2010 | Jeon et al. |
| 2010/0318719 A1 | 12/2010 | Keays et al. |
| 2010/0325340 A1 | 12/2010 | Feldman et al. |
| 2010/0332726 A1 | 12/2010 | Wang |
| 2011/0002224 A1 | 1/2011 | Tamura |
| 2011/0055455 A1 | 3/2011 | Post et al. |
| 2011/0055468 A1 | 3/2011 | Gonzalez et al. |
| 2011/0066788 A1 | 3/2011 | Eleftheriou et al. |
| 2011/0072423 A1 | 3/2011 | Fukata |
| 2011/0078393 A1 | 3/2011 | Lin |
| 2011/0099342 A1 | 4/2011 | Ozdemir |
| 2011/0107144 A1 | 5/2011 | Ohara |
| 2011/0116239 A1 | 5/2011 | Stenfort |
| 2011/0131365 A1 | 6/2011 | Zhang et al. |
| 2011/0131447 A1 | 6/2011 | Prakash et al. |
| 2011/0132000 A1 | 6/2011 | Deane et al. |
| 2011/0138100 A1 | 6/2011 | Sinclair |
| 2011/0145473 A1 | 6/2011 | Maheshwari |
| 2011/0161775 A1 | 6/2011 | Weingarten |
| 2011/0173395 A1 | 7/2011 | Bhattacharjee et al. |
| 2011/0190963 A1 | 8/2011 | Glassl et al. |
| 2011/0191522 A1 | 8/2011 | Condict et al. |
| 2011/0191649 A1 | 8/2011 | Lim et al. |
| 2011/0209032 A1 | 8/2011 | Choi et al. |
| 2011/0238892 A1 | 9/2011 | Tsai et al. |
| 2011/0239088 A1 | 9/2011 | Post |
| 2011/0258496 A1 | 10/2011 | Tseng et al. |
| 2011/0314219 A1 | 12/2011 | Ulrich et al. |
| 2011/0320687 A1 | 12/2011 | Belluomini et al. |
| 2012/0008401 A1 | 1/2012 | Katz et al. |
| 2012/0011336 A1 | 1/2012 | Saika |
| 2012/0023144 A1 | 1/2012 | Rub |
| 2012/0047318 A1 | 2/2012 | Yoon et al. |
| 2012/0047320 A1 | 2/2012 | Yoo et al. |
| 2012/0047409 A1 | 2/2012 | Post et al. |
| 2012/0066450 A1 | 3/2012 | Yochai et al. |
| 2012/0079348 A1 | 3/2012 | Naeimi |
| 2012/0079355 A1 | 3/2012 | Patapoutian et al. |
| 2012/0096217 A1 | 4/2012 | Son et al. |
| 2012/0124046 A1 | 5/2012 | Provenzano |
| 2012/0124273 A1 | 5/2012 | Goss et al. |
| 2012/0151260 A1 | 6/2012 | Zimmermann et al. |
| 2012/0170365 A1 | 7/2012 | Kang et al. |
| 2012/0185706 A1 | 7/2012 | Sistla et al. |
| 2012/0203951 A1 | 8/2012 | Wood et al. |
| 2012/0213004 A1 | 8/2012 | Yun et al. |
| 2012/0216085 A1 | 8/2012 | Weingarten et al. |
| 2012/0236656 A1 | 9/2012 | Cometti |
| 2012/0239858 A1 | 9/2012 | Melik-Martirosian |
| 2012/0254686 A1 | 10/2012 | Esumi et al. |
| 2012/0266011 A1 | 10/2012 | Storer et al. |
| 2012/0266048 A1 | 10/2012 | Chung et al. |
| 2012/0278530 A1 | 11/2012 | Ebsen |
| 2012/0278531 A1 | 11/2012 | Horn |
| 2012/0284587 A1* | 11/2012 | Yu et al. ....................... 714/773 |
| 2012/0297113 A1 | 11/2012 | Belluomini et al. |
| 2012/0311402 A1 | 12/2012 | Tseng et al. |
| 2012/0317334 A1 | 12/2012 | Suzuki et al. |
| 2012/0324191 A1 | 12/2012 | Strange et al. |
| 2012/0331207 A1 | 12/2012 | Lassa et al. |
| 2013/0007380 A1 | 1/2013 | Seekins et al. |
| 2013/0007543 A1* | 1/2013 | Goss ................. G11C 16/3418 714/718 |
| 2013/0054881 A1 | 2/2013 | Ellis et al. |
| 2013/0060994 A1 | 3/2013 | Higgins et al. |
| 2013/0061019 A1 | 3/2013 | Fitzpatrick et al. |
| 2013/0073788 A1 | 3/2013 | Post et al. |
| 2013/0073797 A1 | 3/2013 | Chowdhury |
| 2013/0074093 A1 | 3/2013 | Gounares et al. |
| 2013/0080691 A1 | 3/2013 | Weingarten et al. |
| 2013/0094289 A1 | 4/2013 | Sridharan et al. |
| 2013/0100600 A1 | 4/2013 | Yin et al. |
| 2013/0104005 A1 | 4/2013 | Weingarten et al. |
| 2013/0124792 A1 | 5/2013 | Melik-Martirosian et al. |
| 2013/0151753 A1 | 6/2013 | Jeon et al. |
| 2013/0198436 A1 | 8/2013 | Bandic et al. |
| 2013/0205102 A1 | 8/2013 | Jones et al. |
| 2013/0219248 A1 | 8/2013 | Sakurai |
| 2013/0232290 A1 | 9/2013 | Ish et al. |
| 2013/0238833 A1 | 9/2013 | Vogan et al. |
| 2013/0265825 A1 | 10/2013 | Lassa |
| 2013/0297986 A1 | 11/2013 | Cohen |
| 2013/0297988 A1 | 11/2013 | Wu et al. |
| 2013/0304998 A1 | 11/2013 | Palmer |
| 2013/0305093 A1 | 11/2013 | Jayachandran et al. |
| 2013/0326116 A1 | 12/2013 | Goss et al. |
| 2013/0332791 A1* | 12/2013 | Chu ............................. 714/752 |
| 2014/0036589 A1 | 2/2014 | Parthasarathy et al. |
| 2014/0059359 A1 | 2/2014 | Bahirat |
| 2014/0108891 A1 | 4/2014 | Strasser et al. |
| 2014/0129874 A1 | 5/2014 | Zaltsman et al. |
| 2014/0156966 A1 | 6/2014 | Ellis et al. |
| 2014/0158525 A1 | 6/2014 | Greene |
| 2014/0181370 A1 | 6/2014 | Cohen et al. |
| 2014/0208174 A1 | 7/2014 | Ellis et al. |

(56) References Cited

U.S. PATENT DOCUMENTS

| | | |
|---|---|---|
| 2014/0258769 A1 | 9/2014 | Baryudin et al. |
| 2014/0372777 A1 | 12/2014 | Reller et al. |
| 2015/0177999 A1 | 6/2015 | Gakhal et al. |

FOREIGN PATENT DOCUMENTS

| | | |
|---|---|---|
| EP | 2 498 259 A2 | 9/2012 |
| JP | 2012129859 A | 7/2012 |
| WO | WO 2009/042298 A1 | 4/2009 |
| WO | WO 2011/156466 | 12/2011 |

OTHER PUBLICATIONS

Cooke, "Introduction to Flash Memory (T1A)," Rash Memory Summit, Aug. 22, 2008, Micron Technology, Inc., 102 pages.

Gal et al., "Algorithrms and Data Structures for Flash Memories," ACM Computing Surveys, Jun. 2005, vol. 37, No. 2, 30 pages.

O'Brien, "SMART Storage Systems Optimus SAS Enterprise SSD Review," SMART Storage Systems, Oct. 9, 2012, 44 pages.

IBM Corporation, "Systems Management, Work Management," Version 5, Release 4, 9th Edition Feb. 2006, pp. 1-21.

Spanjer, "Flash Management—Why and How?" Smart Modular Technologies, Nov. 2009, http://www.scantec.de/fileadmin/pdf/Smart_Modular/Flash-Management.pdf, 14 pages.

Texas Instruments, "Power Management IC for Digital Set Top Boxes," SLVSA10A, Sep. 2009, pp. 1-22.

International Search Report and Written Opinion dated Dec. 20, 2013, received in PCT/US2013/045282, which corresponds to U.S. Appl. No. 13/493,949, 7 pages. (Ellis).

International Search Report and Written Opinion dated Jun. 12, 2014 received in PCT/US2014/018972, which corresponds to U.S. Appl. No. 13/779,352, 12 pages (Schmier).

International Search Report and Written Opinion dated May 14, 2014, received in International Patent Application No. PCT/US2014/017168, which corresponds to U.S. Appl. No. 14/076,115, 6 pages. (Fitzpatrick).

International Search Report and Written Opinion dated May 14, 2014, received in International Patent Application No. PCT/US2014/017169, which corresponds to U.S. Appl. No. 14/076,148, 6 pages (Fitzpatrick).

International Search Report and Written Opinion dated Nov. 7, 2014, received in International Patent Application No. PCT/US2014/049732, which corresponds to U.S. Appl. No. 14/334,350, 13 pages. (Fitzpatrick).

International Search Report and Written Opinion dated Oct. 17, 2014, received in International Patent Application No. PCT/US2014/049734, which corresponds to U.S. Appl. No. 14/332,259, 8 pages (Higgins).

International Search Report and Written Opinion dated Oct. 23, 2014, received in International Patent Application No. PCT/US2014/049736, which corresponds to U.S. Appl. No. 14/446,249 8 pages.

International Search Report and Written Opinion dated Nov. 5, 2014, received in International Patent Application No. PCT/US2014/049282, which corresponds to U.S. Appl. No. 13/957,407, 12 pages (Fitzpatrick).

International Search Report and Written Opinion dated Aug. 22, 2014, received in International Patent Application No. PCT/US2014/032978, which corresponds to U.S. Appl. No. 14/081,992, 10 pages (Ellis).

Ulinktech, "ATA Command Table (in Alphabetic Order)," Feb. 6, 2011, http://web.archive.org/web/201102060820/http://www.ulinktech.com/downloads/AT, 6 pages.

International Search Report dated Mar. 25, 2014, received in International Patent Application No. PCT/US2013/072400, which corresponding to U.S. Appl. No. 13/690,337, 3 pages (Ellis).

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Jul. 31, 2014, received in International Patent Application No. PCT/US2014/031465, which corresponds to U.S. Appl. No. 13/851,928, 13 pages (Ellis).

International Search Report and Written Opinion dated Jul. 31, 2014, received in International Patent Application No. PCT/US2014/0338769, which corresponds to U.S. Appl. No. 13/861,326, 9 pages (Fitzpatrick).

Narayanan et al., "Migrating Server Storage to SSDs: Analysis of Tradeoffs," Computer Systems, Apr. 2009, 12 pages.

Shiraz et al., "Block Aging Prevention Technique (BAP) for Flash Based Solid State Disks," 7th International Conference on Emerging Technologies (ICET), Sep. 5, 2011, 6 pages.

Tai et al, "Prolongation of Lifetime and the Evaluation Method of Dependable SSD," 25 International Symposium on Defect and Fault Tolerance in VLSI Systems, 2010, NJ, USA, 8 pages.

Yimo et al., "WeLe-RAID: A SSD-Based RAID for System Endurance and Performance," Jan. 2011, Network and Parallel Computing, Springer, 14 pages.

International Search Report and Written Opinion dated Jan. 9, 2015, received in International Patent Application No. PCT/US2014/049731, which corresponds to U.S. Appl. No. 14/334,324, 9 pages (Fitzpatrick).

International Search Report and Written Opinion dated Feb. 18, 2015, received in International Patent Application No. PCT/US2014/065401, which corresponds to U.S. Appl. No. 14/082,031, 9 pages (Higgins).

International Search Report dated Apr. 15, 2014, received in International Patent Application No. PCT/US2013/078340, which corresponds to U.S. Appl. No. 13/746,542, 11 pages.

Online Merriam Webster Dictionary, definition of "Distinct" from Jun. 12, 2011, https://web.archive.org/web/20110612181129/http://www2.merriam-webster.com/cgi-bin/mwdictadu?book=Dictionary&va=distinct.

\* cited by examiner

STORAGE CONTROL SYSTEM WITH POWER-OFF TIME ESTIMATION MECHANISM AND METHOD OF OPERATION THEREOF

TECHNICAL FIELD

The present invention relates generally to a storage control system and more particularly to a system for data management.

BACKGROUND ART

Data storage, often called storage or memory, refers to computer components and recording media that retain digital data. Data storage is a core function and fundamental component of consumer and industrial electronics, especially devices such as computers, televisions, cellular phones, mobile devices, and digital video cameras.

Recently, forms of long-term storage other than electromechanical hard disks have become feasible for use in computers. NOT-AND (NAND) flash is one form of non-volatile memory used in solid-state storage devices. The memory cells are arranged in typical row and column fashion with circuitry for accessing individual cells. The memory transistors of those cells are placed to store an analog value that can be interpreted to hold two logical states in the case of Single Level Cell (SLC) or more than two logical states in the case of Multi Level Cell (MLC).

A flash memory cell is light in weight, occupies very little space, and consumes less power than electromechanical disk drives. Construction of a storage system with this type of memory allows for much higher bandwidths and input/output operations per second (IOPS) than typical electromechanical disk drives. More importantly, it is especially rugged and can operate at a much high temperature range. It will withstand without adverse effects repeated drops, each of which would destroy a typical electromechanical hard disk drive. A problem exhibited by flash memory is that it tends to have a limited life in use.

Thus, a need still remains for better data, management devices. In view of the increasing demand for data management devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a storage control system, including: powering off a memory sub-system; estimating a power-off decay rate upon the memory sub-system powered up, the power-off decay rate is for indicating how much data in the memory sub-system has decayed while the memory sub-system has been powered down; and recycling an erase block for data retention based on the power-off decay rate.

The present invention provides a storage control system, including: a power-down module for powering off a memory sub-system; a decay estimation module, coupled to the power-down module, for estimating a power-off decay rate upon the memory sub-system powered up, the power-off decay rate is for indicating how much data in the memory sub-system has decayed while the memory sub-system has been powered down; and a recycle module, coupled to the decay estimation module, for recycling an erase block for data retention based on the power-off decay rate.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
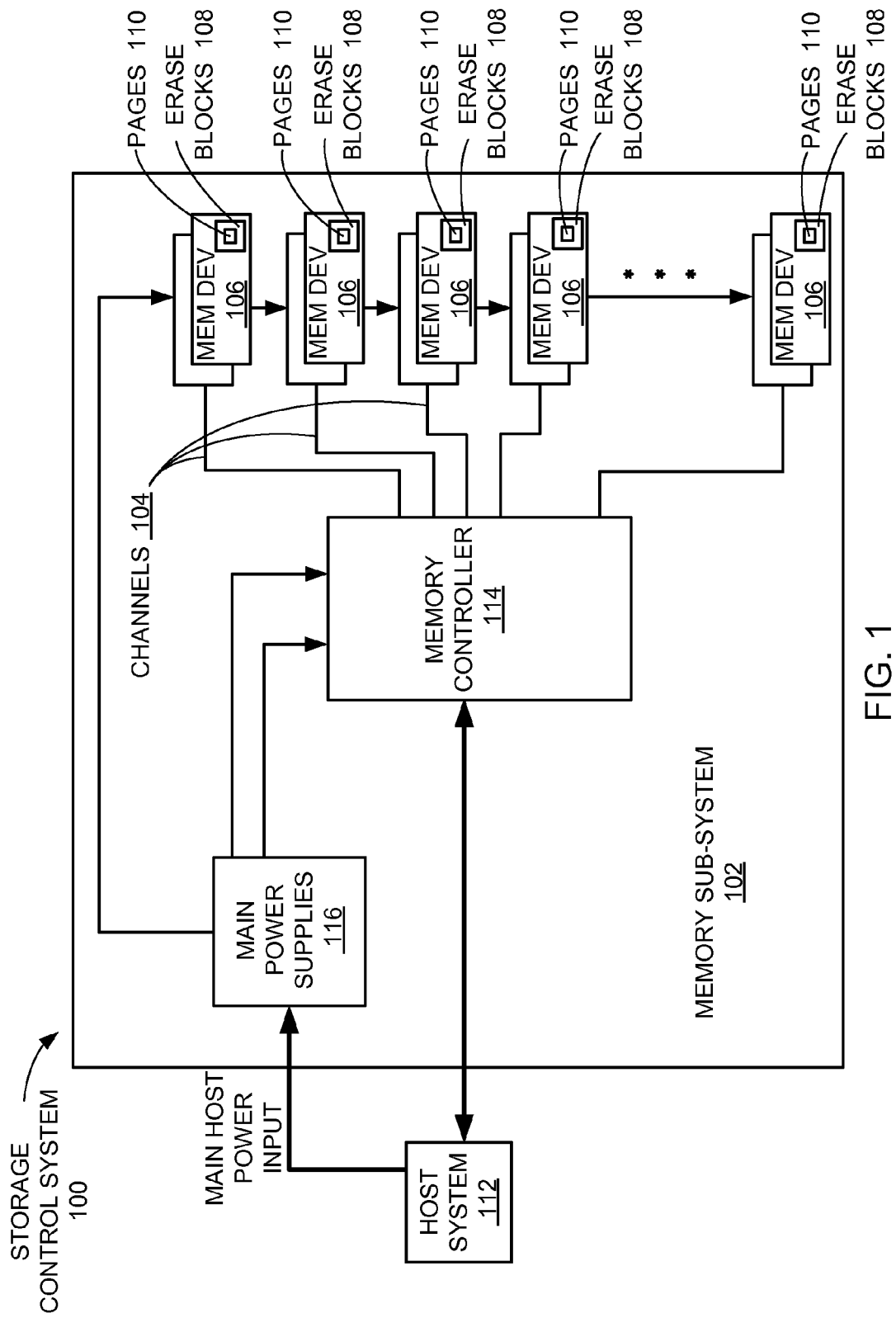
FIG. 1 is a storage control system with power-off time estimation mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "module" referred to herein can include software, hardware, or a combination thereof in the present invention in accordance with the context in which the term is used. For example, the software can be machine code, firmware, embedded code, and application software. Also for example, the hardware can be circuitry, processor, computer, integrated circuit, integrated circuit cores, a microelectromechanical system (MEMS), passive devices, environmental sensors including temperature sensors, or a combination thereof.

The term "erase block" referred to herein is defined as a group of pages that is the smallest number of pages that are erased at one time. The term "age" referred to herein is defined as a measure of an ability of a memory device including NAND to store data. For example, young-aged NAND has better data retention capability, and older-aged NAND has worse data-retention capability. Also for example, there are numerous methods for measuring NAND age, including program/erase (P/E) cycle counts, bit error rate (BER), program time, optimal read threshold, erase time, etc.

The term "bit error rate" (BER) referred to herein is defined as a number of incorrect bits in a data stream stored in a memory device including NAND. The BER can typically be detected within a code word protected by error correction code (ECC). The term "threshold voltage" (Vth) referred to herein is defined as a voltage setting applied to internal comparators of a memory device including NAND, which determine digital values stored in the memory device's cells. The term "error correction code" (ECC) referred to herein is defined as parity data generated over a set of data grouped into a code word. The term "retention" referred to herein is defined as an ability of memory cells to retain the programmed or correct information.

The term "program/erase cycle" (P/E cycle) referred to herein is defined as a base level operation of how data is replaced within an erase block. For example, a memory device including NAND and other memory types can have a limited number of useful P/E cycles. The term "recycling" referred to herein is defined as moving data from one flash page to another flash page for the purposes of either freeing up erase blocks to write new host data or to ensure that the data on the erase block is preserved. The term "decay" referred to herein is defined as an inability of memory cells to retain the programmed or correct information resulting in loss of the information.

In the past when solid state drives (SSDs) used SLC type NAND flash devices, data retention was 5 years or better. A number of P/E cycles was specified at 100,000, and typically, the devices were good from 300,000 to 1,000,000 P/E cycles. Therefore, active actions for data retention were not required. Now that MLC NAND devices with P/E cycles with as little as 3,000 or less and retention of 3 months or less are being used, the need to recycling for data retention is critical.

One method for solving read retention was to have the SSD blindly move data, by re-writing via recycling, in a round robin scheme based on its logical block address (LBA). This method ignored any information about when the LBA it was moving was written, even if it was just written as the last operation performed. The trigger for this was typically a host write operation, and if there were no host write operations, the data could have retention issues.

As an example, the method described above can be implemented using an algorithm as follows.

For LBA=1 to a total number of LBAs in an SSD
   Re-write (move) LBA
   LBA=LBA+1

Another method relied on a host system doing enough writes in a given time period (days or weeks) as to have re-written the drive data completely in that give time period. The general recycling or garbage collection scheme would be enough to imply complete data movement with the data pool. If the drive was used for a read mostly or read only application, no recycling would take place and the data would fail to be reliable after shorter retention periods. This is still a problem in some Flash controllers used for Compact Flash (CF) cards, Secure Digital (SD) cards, and micro SD cards today.

Referring now to FIG. 1, therein is shown a storage control system 100 with power-off time estimation mechanism in an embodiment of the present invention. For example, FIG. 1 depicts a basic architecture or system-level block diagram of the storage control system 100 with a solid state drive.

FIG. 1 depicts a memory sub-system 102 including a solid state drive (SSD). The memory sub-system 102 can have a number of channels 104 with each of the channels 104 having a number of memory devices 106 including non-volatile or NAND devices behind it.

Each of 1 to N of the memory devices 106 in each of the channels 104 can include a number of erase blocks 108, where N is a counting number. For example, each of the memory devices 106 can include 4096 of the erase blocks 108. Each of the erase blocks 108 can have a number of pages 110. For example, each of the erase blocks 108 can include 256 of the pages 110.

A host system 112 can communicate with a memory controller 114 of the memory sub-system 102. As the host system 112 writes data, the data can be recorded or stored in the memory devices 106. The memory controller 114 interfaces with the host system 112 and controls the memory devices 106 to transfer data between the host system 112 and the memory devices 106.

There are a number of ways of distributing the data across the channels 104. For example, the data can be distributed using a simple redundant array of independent disks (RAID) 0 stripe.

The memory sub-system 102 can include main power supplies 116 to provide power sources to the memory controller 114 and the memory devices 106. The main power supplies 116 can be sourced by a main host power input from the host system 112.

Figure 2:
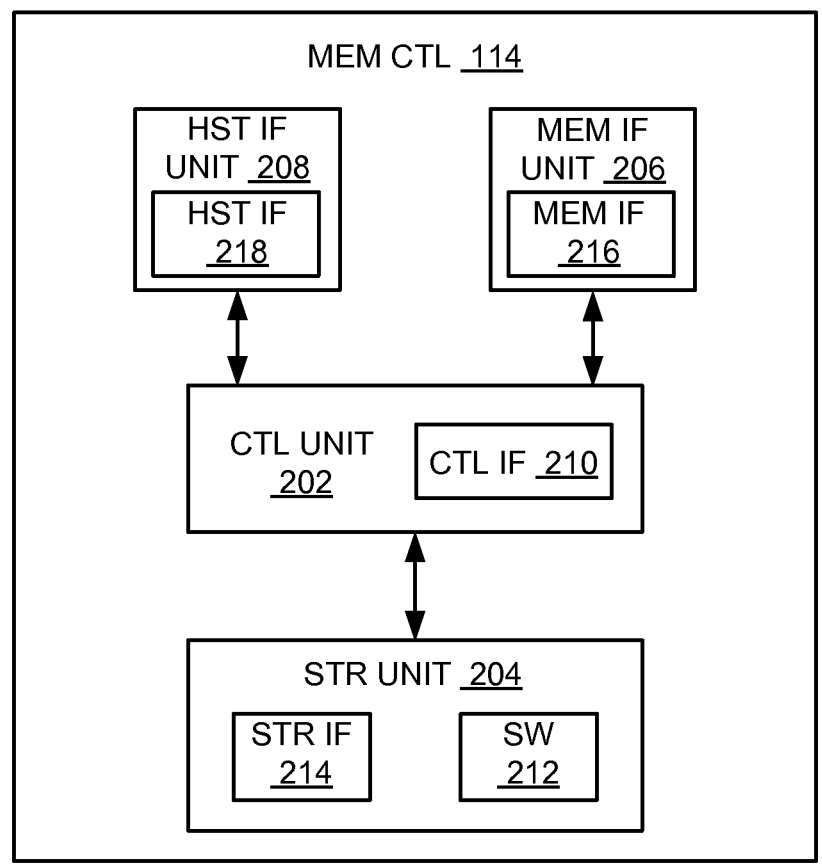
FIG. 2 is an exemplary hardware block diagram of the memory controller.

Referring now to FIG. 2, therein is shown an exemplary hardware block diagram of the memory controller 114. The memory controller 114 can include a control unit 202, a storage unit 204, a memory interface unit 206, and a host interface unit 208. The control unit 202 can include a control interface 210. The control unit 202 can execute software 212 stored in the storage unit 204 to provide the intelligence of the memory controller 114.

The control unit 202 can be implemented in a number of different manners. For example, the control unit 202 can be a processor, an embedded processor, a microprocessor, a hardware control logic, a hardware finite state machine (FSM), a digital signal processor (DSP), or a combination thereof.

The control interface 210 can be used for communication between the control unit 202 and other functional units in the memory controller 114. The control interface 210 can also be used for communication that is external to the memory controller 114.

The control interface 210 can receive information from the other functional units or from external sources, or can transmit information to the other functional units or to external destinations. The external sources and the external destinations refer to sources and destinations external to the memory controller 114.

The control interface 210 can be implemented in different ways and can include different implementations depending on which functional units or external units are being interfaced with the control interface 210. For example, the control interface 210 can be implemented with a dedicated hardware including an application-specific integrated circuit (ASIC), a configurable hardware including a field-programmable gate array (FPGA), a discrete electronic hardware, or a combination thereof.

The storage unit 204 can include both hardware and the software 212. For example, the software 212 can include control firmware. The storage unit 204 can include a volatile memory, a nonvolatile memory, an internal memory, an external memory, or a combination thereof. For example, the storage unit 204 can be a nonvolatile storage such as non-volatile random access memory (NVRAM), Flash memory, disk storage, or a volatile storage such as static random access memory (SRAM).

The storage unit 204 can include a storage interface 214. The storage interface 214 can also be used for communication that is external to the memory controller 114. The storage interface 214 can receive information from the other functional units or from external sources, or can transmit information to the other functional units or to external destinations. The external sources and the external destinations refer to sources and destinations external to the memory controller 114.

The storage interface 214 can include different implementations depending on which functional units or external units are being interfaced with the storage unit 204. The storage interface 214 can be implemented with technologies and techniques similar to the implementation of the control interface 210.

The memory interface unit 206 can enable external communication to and from the memory controller 114. For example, the memory interface unit 206 can permit the memory controller 114 to communicate with the memory devices 106 of FIG. 1.

The memory interface unit 206 can include a memory interface 216. The memory interface 216 can be used for communication between the memory interface unit 206 and other functional units in the memory controller 114. The memory interface 216 can receive information from the other functional units or can transmit information to the other functional units.

The memory interface 216 can include different implementations depending on which functional units are being interfaced with the memory interface unit 206. The memory interface 216 can be implemented with technologies and techniques similar to the implementation of the control interface 210.

The host interface unit 208 allows the host system 112 of FIG. 1 to interface and interact with the memory controller 114. The host interface unit 208 can include a host interface 218 to provide communication mechanism between the host interface unit 208 and the host system 112.

The control unit 202 can operate the host interface unit 208 to send control or status information generated by the memory controller 114 to the host system 112. The control unit 202 can also execute the software 212 for the other functions of the memory controller 114. The control unit 202 can further execute the software 212 for interaction with the memory devices 106 via the memory interface unit 206.

The functional units in the memory controller 114 can work individually and independently of the other functional units. For illustrative purposes, the memory controller 114 is described by operation of the memory controller 114 with the host system 112 and the memory devices 106. It is understood that the memory controller 114, the host system 112, and the memory devices 106 can operate any of the modules and functions of the memory controller 114.

Figure 3:
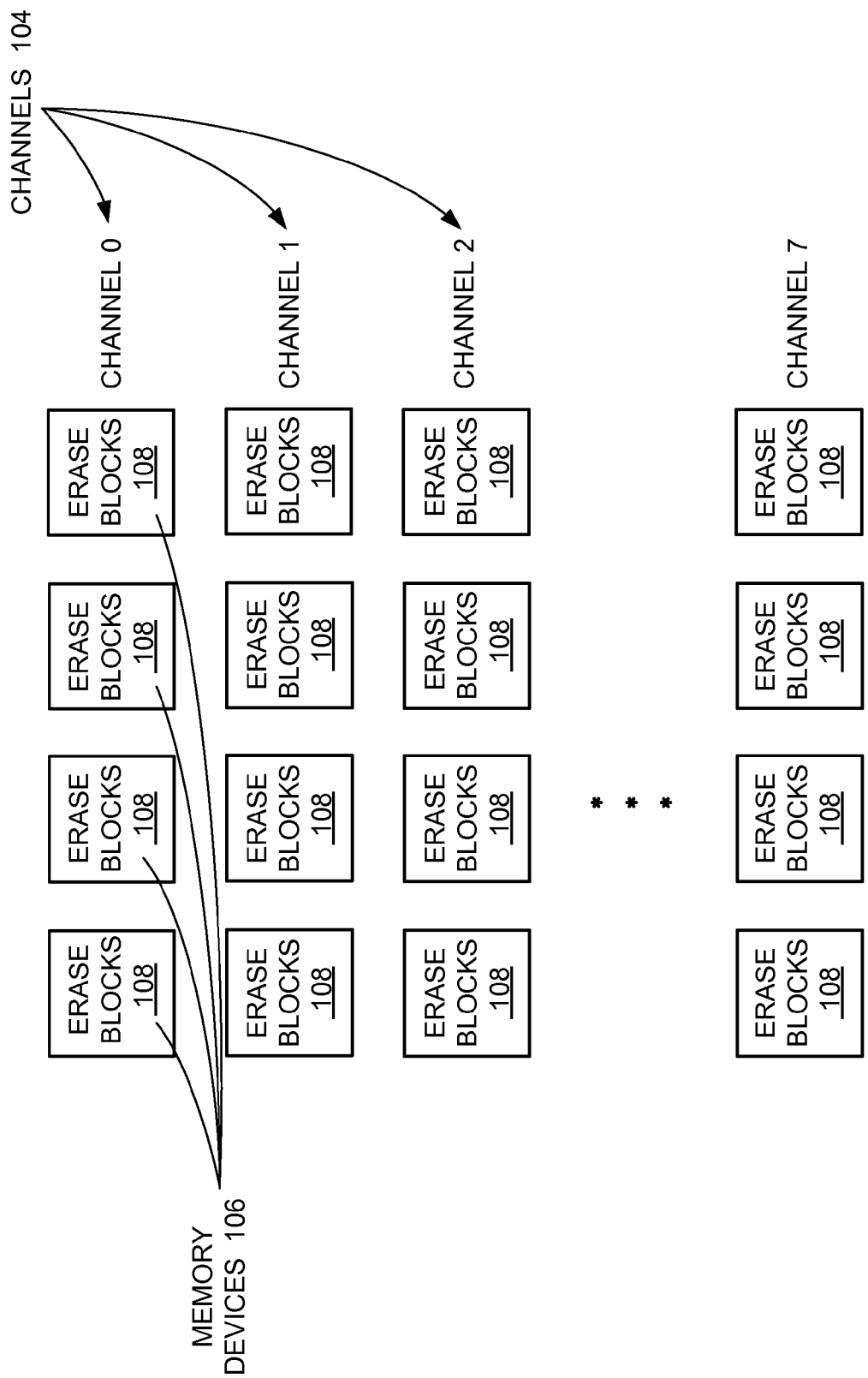
FIG. 3 is an exemplary functional diagram of a number of the erase blocks per each of the channels.

Referring now to FIG. 3, therein is shown an exemplary functional diagram of a number of the erase blocks 108 per each of the channels 104. For example, FIG. 3 shows four of the memory devices 106 behind each of the channels 104, although it is understood that each of the channels 104 can be associated with any number of the memory devices 106. Also for example, the memory devices 106 can be logical units (LUNs) or dies.

For example, each of the memory devices 106 can have 4096 of the erase blocks 108, although it is understood that each of the memory devices 106 can have any number of the erase blocks 108. Also for example, FIG. 3 shows eight of the channels 104 including NAND channels, although it is understood that there can be any number of the channels 104 in the memory sub-system 102 of FIG. 1.

Figure 4:
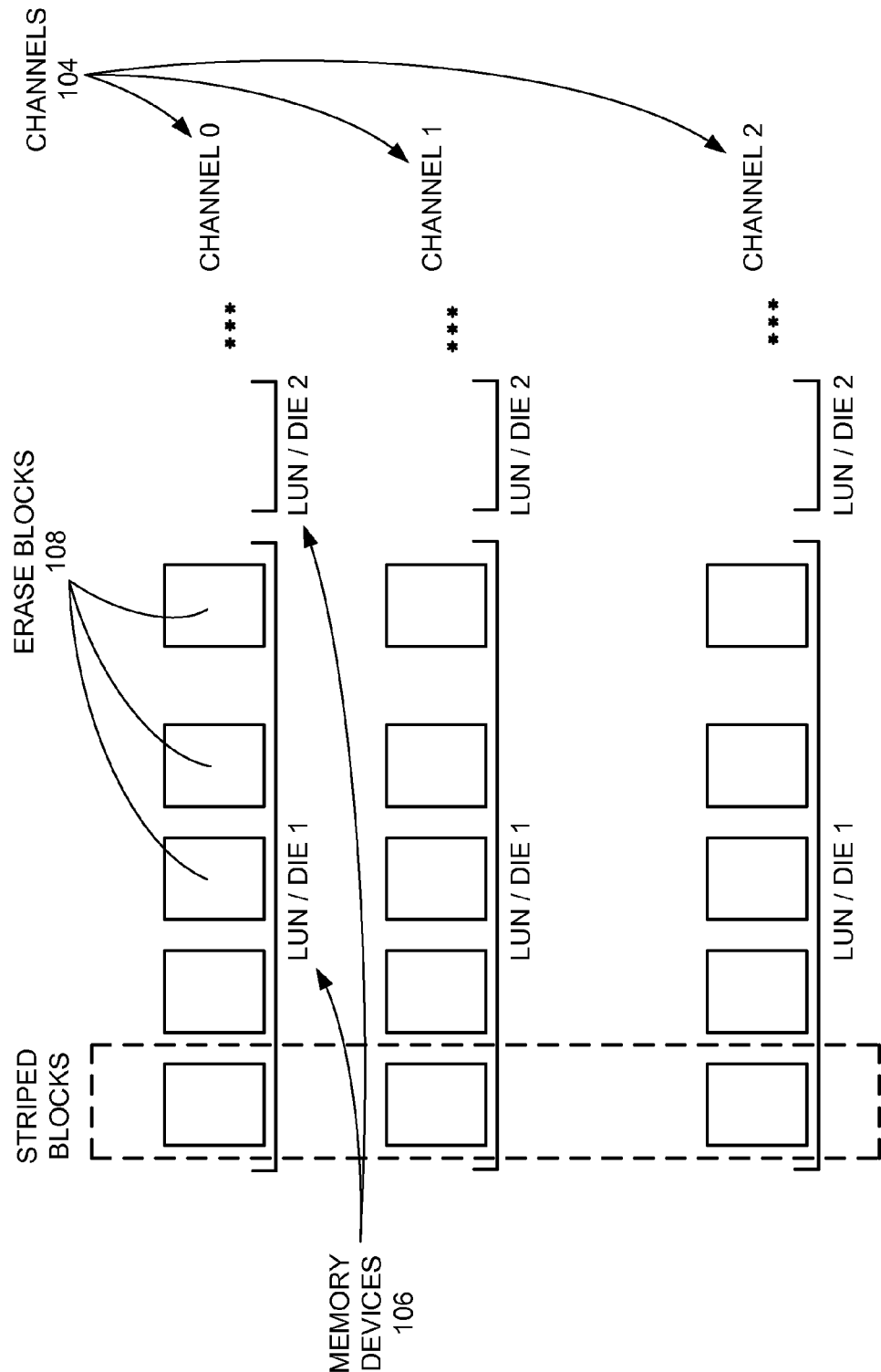
FIG. 4 is an exemplary functional diagram of a group of the erase blocks that share the same age.

Referring now to FIG. 4, therein is shown an exemplary functional diagram of a group of the erase blocks 108 that share the same age. For example, FIG. 4 shows a typical RAID 0 stripe, shown with a dash rectangle. RAID 0 is one of many ways that the memory sub-system 102 of FIG. 1 can store host data in the NAND or the memory devices 106. The RAID 0 stripe can be grouped in such a way that there is one of the erase blocks 108 from each of the channels 104 associated with a host write group. This is sometimes called a super block.

The age of the data in this grouped set of the erase blocks 108 can all be the same as it is written sequentially. If there is a big time gap between page host writes, this group of data can have a range of ages, but the next grouped set of the erase blocks 108 can have a younger age since it can be written later. The absolute organization of striping or grouping of the erase blocks 108 can be varied.

For example, it is more likely that the erase blocks 108 of the same age live in the same stripe (across the channels 104), as the stripe is written as one or very closely in time. This is from using the channels 104 in a RAID 0 configuration. Also for example, data can be written using the channels 104 in any configuration. As a specific example, the data can be written across the channels 104. Further, for example, in general the erase blocks 108 of the same age can be located anywhere within the total pool of the erase blocks 108.

Figure 5:
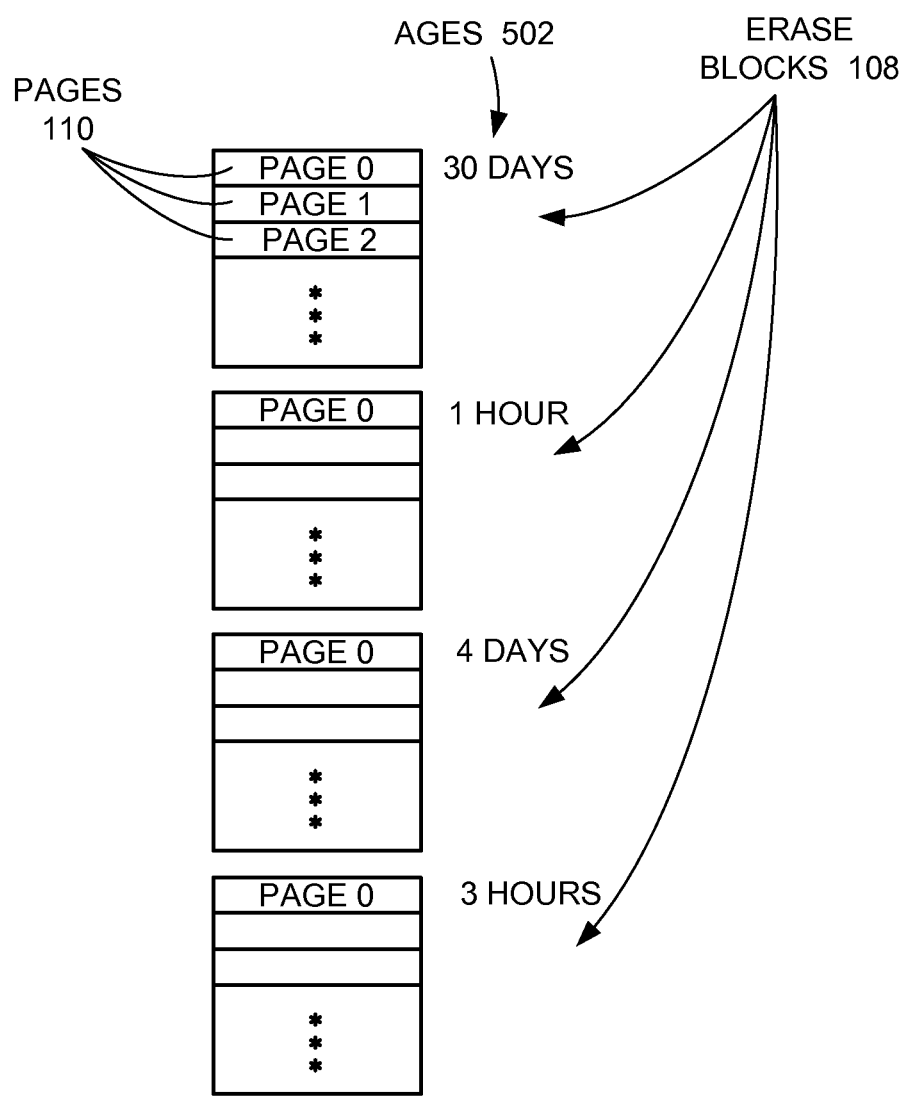
FIG. 5 is an exemplary functional diagram of the erase blocks with different ages.

Referring now to FIG. 5, therein is shown an exemplary functional diagram of the erase blocks 108 with different ages 502. FIG. 5 depicts an exemplary snapshot of the erase blocks 108 with the ages 502. For example, FIG. 5 is shown with four of the erase blocks 108 from all active blocks from one of the channels 104 of FIG. 1 with different values of the ages 502, such as 30 days, 1 hour, 4 days, and 3 hours.

FIG. 5 shows an organization of data in the pages 110 by independent instances of the erase blocks 108. The ages 502 of data in each of the erase blocks 108 can have sequential values. FIG. 5 also shows how the erase blocks 108 with different values of the ages 502 can be scattered.

Figure 6:
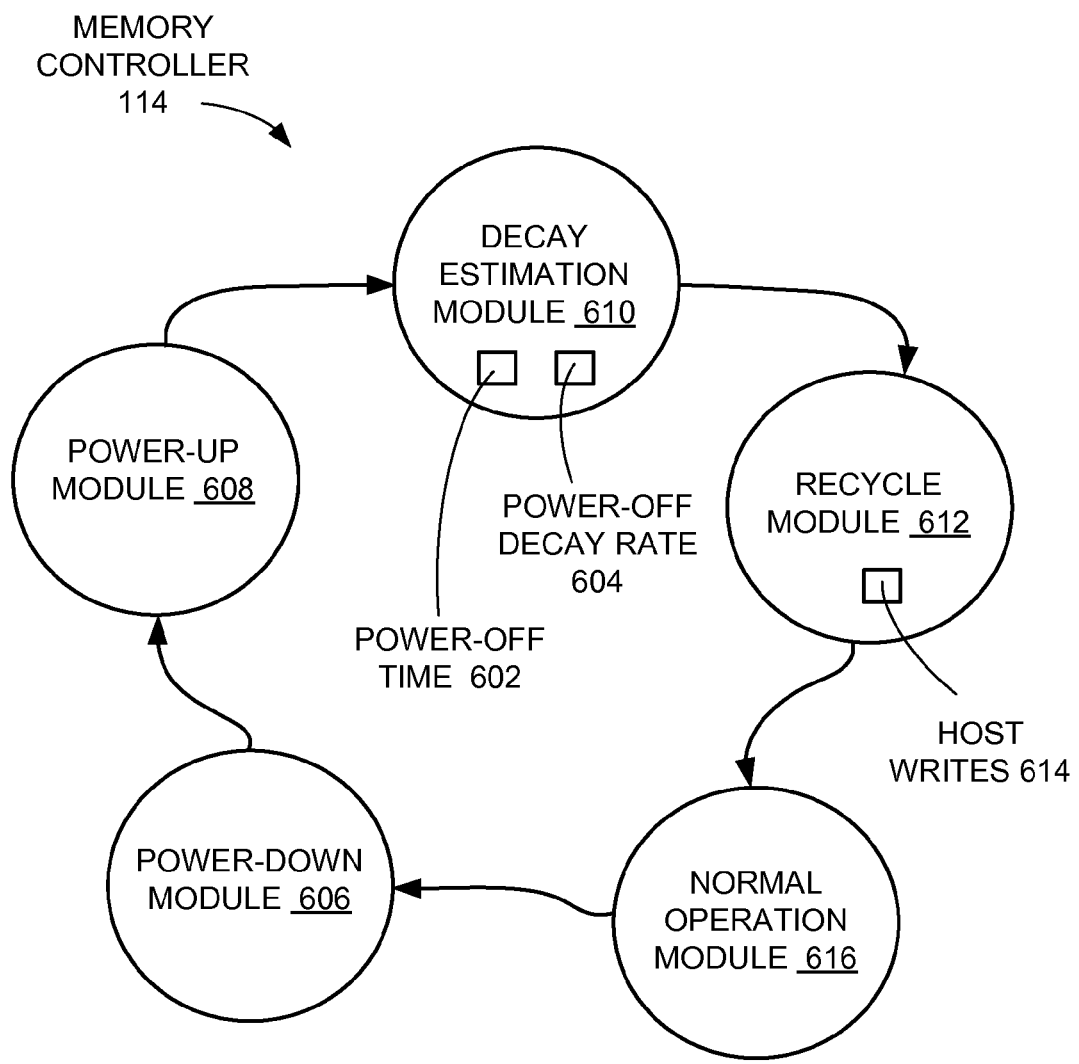
FIG. 6 is a workflow diagram of the memory controller.

Referring now to FIG. 6, therein is shown a workflow diagram of the memory controller 114. After data is written to the memory devices 106 of FIG. 1 including NAND flash, the data can decay over time. If the data is left on a particular instance of the erase blocks 108 of FIG. 1 of the memory devices 106 indefinitely, eventually too much of the data can become corrupt and the data can be unobtainable even with ECC correction. This effect can occur whether a solid state drive (SSD) or the memory sub-system 102 of FIG. 1 is powered on or powered off.

For example, if a particular NAND flash or one of the memory devices 106 is capable of retaining data for 3 months at a particular temperature, and the SSD has data written to it and immediately stored for 2.5 months, the data on the SSD can be vulnerable to data loss if the data is not moved within 0.5 months. In an extreme case, the SSD can be powered off for the entire duration that the NAND flash or the memory devices 106 can be capable of retaining the data and then powered on; in that case, the data can be vulnerable unless the SSD takes immediate action to move the data to new instances of the erase blocks 108.

There are at least two simple approaches to the problem:

1. Ignore the issue and always power up assuming no decay has occurred during power off. To avoid losing the data, an SSD with this approach will have to have a lot of margin on its flash to absorb possible power-off retention decay. Thus, this approach eats into and thus negatively affects endurance.

2. Every time the drive powers up, assume there could have been decay and refresh all the data on the drive. This has a performance and endurance impact because many power-off times will be very short and thus do not require refreshing all the data.

In contrast, the purpose of the memory controller 114 as described herein is for an SSD or the memory sub-system 102 that takes a power-off time 602 into account when determining whether it needs to move data to different instances of the erase blocks 108. A method is to determine which of the erase blocks 108, if any, require refresh and then only recycling data on those instances of the erase blocks 108. This allows avoiding the costs of the simple approaches described above. A number of specific methods for estimating a power-off decay rate 604 will be described in more details.

A key concept as described herein is that the SSD or the memory sub-system 102 is able to estimate how much the data in the SSD has decayed while the SSD has been powered off by a power-down module 606. This decay rate or the power-off decay rate 604 is a function of both time and temperature. For example, the power-off decay rate 604 can be directly proportional to time and temperature. As a specific example, at hotter temperatures, the flash or the memory devices 106 lose their data faster.

On power-up by a power-up module 608, the SSD can detect how many of the erase blocks 108 are vulnerable to losing data using a decay estimation module 610, The decay estimation module 610 can estimate the power-off time 602 in the SSD. If the detected issues are large, the SSD may elect to refresh all data using a recycle module 612. The recycle module 612 recycles data on the erase blocks 108 that are vulnerable to data loss.

The embodiments described herein can include a notion that the SSD can mix data-retention recycling with other drive operations including new host writes 614, which are operations for storing data from the host system 112 of FIG. 1 to the memory sub-system 102. As an example, an efficient way to handle this mix is to use the recycle module 612 to adjust how quickly the SSD recycles for data retention based on how many data-retention recycles it has pending. For example, if the SSD powers up and discovers that nearly all of its data is at risk, it can accelerate movement of the erase blocks 108 through a write queue so that the SSD can perform relatively more data-retention recycles compared to other writes including the host writes 614.

Upon completion of the recycle module 612, normal operation of the SSD can be performed with a normal operation module 616. The normal operation module 616 performs operations including interfacing with the host system 112 and the memory devices 106 to read, write, and delete data from or to a logical address space for control and management of the data from the host system 112.

If using time pools, the SSD can increase an effective time that each time tick represents until data-retention risk is eliminated. The time pools are the erase blocks 108 that are grouped in the SSD). The SSD can place the erase blocks 108 that are newly written in the most-recent time pool. Each time pool represents one time period, and each time period that elapses, the contents of each time pool can be shifted to the next-oldest time pool.

The terms "oldest" and "freshest" referred to herein are associated with how recent data has been written. For example, the data can be determined as oldest or freshest based on a time stamp on the data. The time stamp is a numerical value of a time of day.

The time pool at the end of the chain holds the erase blocks 108 that are at risk of data-retention issues. If the SSD has the erase blocks 108 in the last time pool, it can move the data to other instances of the erase blocks 108 before any of the erase blocks 108 hits or reaches a threshold where data retention is suspected.

For example, the SSD can only hold data for 20 days without the data becoming at risk due to flash limitations. In this case, there can be 20 time pools, with a time period being 1 day between the time pools.

The concepts described herein can be constructed and used in a solid state drive (SSD) under development. This concept can also be retrofitted into almost any SSD product with a design that requires a process to recover data after long retention times or an increase in data integrity at boot time.

Functions or operations of the memory controller 114 as described above can be implemented in hardware, software, or a combination thereof. The memory controller 114 can be implemented with the control unit 202 of FIG. 2, the storage unit 204 of FIG. 2, the memory interface unit 206 of FIG. 2, the host interface unit 208 of FIG. 2, or a combination thereof.

For example, the power-down module 606 can be implemented with the control unit 202 to power off the memory sub-system 102. Also for example, the power-up module 608 can be implemented with the control unit 202 to power up the memory sub-system 102.

For example, the decay estimation module 610 can be implemented with the control unit 202 to estimate the power-off decay rate 604 upon the memory sub-system 102 powered up. Also for example, the recycle module 612 can be implemented with the control unit 202 to recycle the erase blocks 108 for data retention based on the power-off decay rate 604.

The power-down module 606 can be coupled to the power-up module 608 and the normal operation module 616. The power-up module 608 can be coupled to the decay estimation module 610. The decay estimation module 610 can be coupled to the recycle module 612. The recycle module 612 can be coupled to the normal operation module 616.

The storage control system 100 of FIG. 1 is described with module functions or order as an example. The modules can be partitioned differently. For example, the power-down module 606 and the power-up module 608 can be combined. Each of the modules can operate individually and independently of the other modules.

Further, data generated in one module can be used by another module without being directly coupled to each other. Yet further, the power-down module 606, the power-up module 608, the decay estimation module 610, the recycle module 612, and the normal operation module 616 can be implemented as hardware accelerators (not shown) within the control unit 202 or can be implemented as hardware accelerators (not shown) in the memory controller 114 or outside of the memory controller 114.

Figure 7:
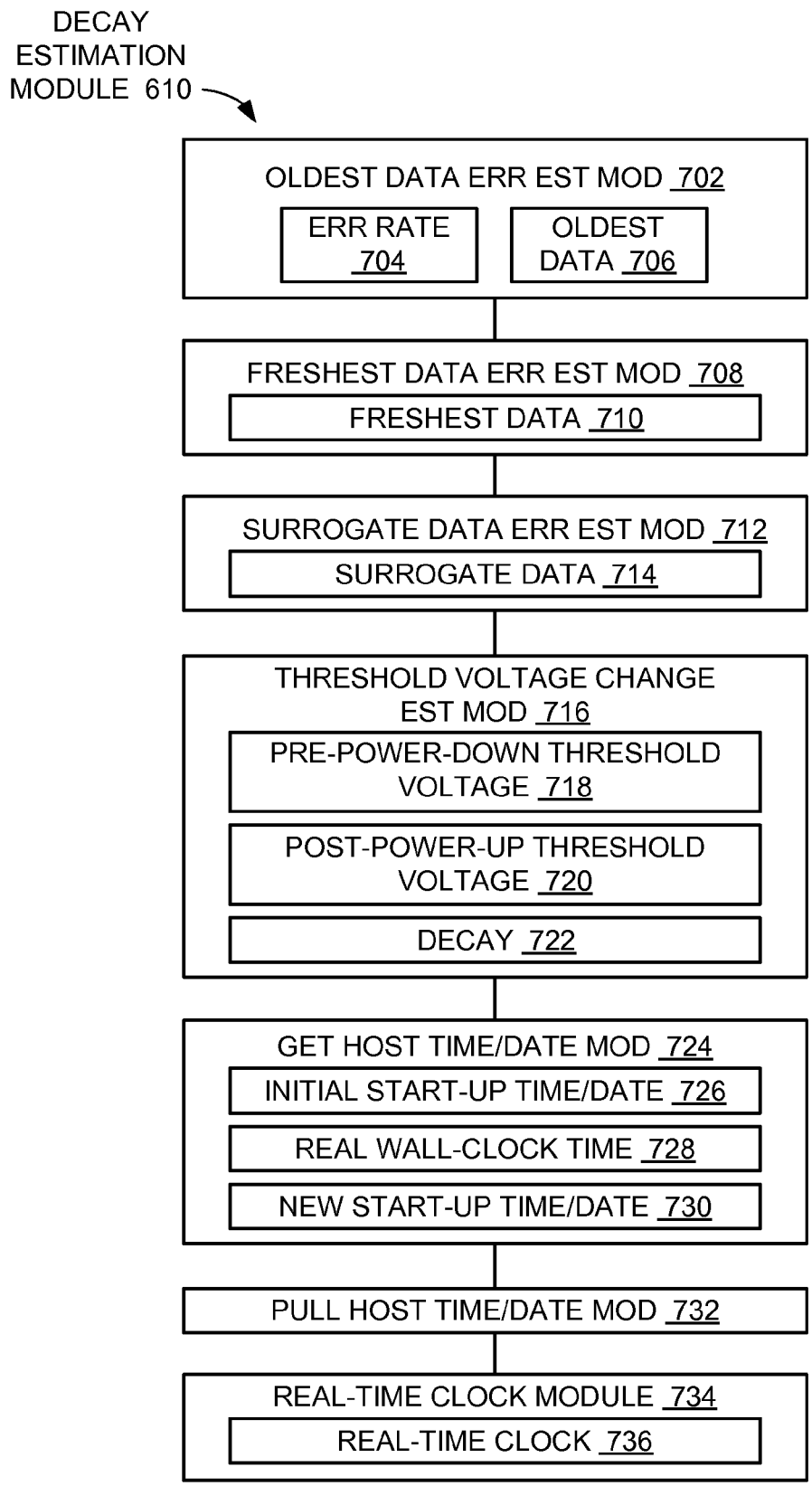
FIG. 7 is a detailed functional diagram of the decay estimation module.

Referring now to FIG. 7, therein is shown a detailed functional diagram of the decay estimation module 610. The embodiments described herein can include a number of methods using modules implemented in the decay estimation module 610 as described below for estimating the power-off decay rate 604 of FIG. 6 and the power-off time 602 of FIG. 6.

The decay estimation module 610 can include an oldest data error estimation module 702 to determine an error rate 704 of oldest data 706, which are information that has least recently been written to the memory devices 106 of FIG. 1. An increase or decrease in the value of the error rate 704 indicates that the power-off decay rate 604 increases or decreases, respectively. First, the decay estimation module 610 can estimate the data retention of the oldest data 706 in one of the erase blocks 108 of FIG. 1 that was written to the longest time ago.

If the oldest data 706 is at risk of data loss, the decay estimation module 610 can flag it to the recycle module 612 of FIG. 6 for data-retention recycling. The decay estimation module 610 can keep examining the erase blocks 108 in order of oldest-to-freshest data until it comes across the erase blocks 108 that do not have data-retention issues and stops there.

For example, the oldest data 706 on the SSD can be determined by looking at a sequence number that is written out with data. This sequence number is sequential and contiguous in that the number is incremented on every write operation and stored in metadata along with the data. The sequence number does not have any indication of an amount of time between sequence number writes.

For example, the oldest data error estimation module 702 can be implemented using a threshold for bit error rates. For example, the threshold can be an expected bit error rate. When the bit error rates are higher than the threshold, the erase blocks 108, for which the bit error rates are determined, can be recycled. As long as the oldest data error estimation module 702 detects the bit error rates above the threshold, it can continue the recycling process until it detects the erase blocks 108 having the bit error rates below the threshold. All the erase blocks 108 above the threshold can be determined to be in critical need of recycling.

Also for example, the ages 502 of FIG. 5 of a flash die can be associated with particular bit error rates. When the memory sub-system 102 of FIG. 1 is powered up, the oldest data error estimation module 702 can estimate the retention of the die in terms of how it performs after the power-off time 602 based on the ages 502. Then, the oldest data error estimation module 702 can determine a difference in performance, determine how much retention time that each of the ages 502 can support, and then use that difference to determine how much retention time might have elapsed.

The oldest data error estimation module 702 can be implemented using methods employing gradients to determine how much decay in the erase blocks 108 has occurred. For example, the amount of decay in the erase blocks 108 can be used to determine a number of days that have passed while the SSD has been powered down.

For efficiency, the decay estimation module 610 can choose representative samples of the erase blocks 108 to examine rather than examining every one of the erase blocks 108 providing improved performance when the SSD boots up. For example, the representative samples can be one out of every N of the erase blocks 108, where N is a predetermined numerical value. Also for example, a range of one to four out of 4,096 of the erase blocks 108 per flash die or one of the memory devices 106 can be selected for the representative samples. A change in BER of two of the erase blocks 108 per flash die can be examined.

The decay estimation module 610 can include a freshest data error estimation module 708 to determine the error rate 704 of most-recent data or freshest data 710, which are information that has most recently been written to the memory devices 106. In this scheme, during power down, the memory controller 114 of FIG. 1 can record the data that it wrote most recently in order to determine the freshest data 710.

When powering up, the freshest data error estimation module 708 can examine one of the erase blocks 108 with the freshest data 710 and estimate its data retention. The freshest data error estimation module 708 can then use this result to estimate data retention of other instances of the erase blocks 108 in the SSD.

The decay estimation module 610 can include a surrogate data error estimation module 712 to determine the error rate 704 of surrogate data 714, which are information in a surrogate portion of the memory devices 106 set aside by the memory controller 114 as a measure of data retention for the SSD. The surrogate data error estimation module 712 can precondition the surrogate portion of the memory devices 106 to a known data retention state.

For example, the surrogate data error estimation module 712 can utilize the surrogate portion of the memory devices 106 for a certain number of program/erase cycles and with a certain pattern. It can then examine the surrogate data 714 in the surrogate portion on power up to estimate the data, retention effect during the power loss to determine the error rate 704 of the surrogate data 714.

The decay estimation module 610 can include a threshold voltage change estimation module 716 to determine the power-off decay rate 604. Similar to the error-rate changes described above, the memory controller 114 can record an optimal read threshold or a pre-power-down threshold voltage 718 prior to powering down. The pre-power-down threshold voltage 718 can be recorded by the normal operation module 616 of FIG. 6 prior to being powered down.

The pre-power-down threshold voltage 718 can be recorded for a subset of the erase blocks 108 and the pages 110 of FIG. 1 associated thereof. The threshold voltage change estimation module 716 can determine an optimal read threshold or a post-power-up threshold voltage 720 after power up for the same instances of the erase blocks 108 and the pages 110. If the optimal read threshold is unchanged, the threshold voltage change estimation module 716 can infer that little or no power-off retention issues were introduced. The optimal read threshold can be determined as unchanged when a difference between the pre-power-down threshold voltage 718 and the post-power-up threshold voltage 720 is zero.

The further the optimal read threshold is shifted away from normal (or center), the less data retention the erase blocks 108 can have. A big shift in threshold signals the erase blocks 108 at greater risk. The optimal read threshold can further shift when the post-power-up threshold voltage 720 is further away from the pre-power-down threshold voltage 718. For example, the post-power-up threshold voltage 720 is further shifted when the post-power-up threshold voltage 720 is increasingly lower than the pre-power-down threshold voltage 718.

Using the optimal read threshold including the pre-power-down threshold voltage 718 and the post-power-up threshold voltage xx, the SSD can use a formula in Equation 1 to estimate a decay 722, which can be used to estimate a retention time. The decay 722 is a numerical value that indicates an amount or how much data stored in the erase blocks 108 has decayed.

$$\text{Decay} = (\text{optimal\_Vth}_{t0} - \text{optimal\_Vth}_{t1}) * K(\text{age}, \text{dwell}), \quad (1)$$

where "Decay" is the decay 722, "optimal_Vth$_{t0}$" is the pre-power-down threshold voltage 718, "optimal_Vth$_{t1}$" is the post-power-up threshold voltage 720, and "K" is a constant based on age and dwell of the memory devices 106. The power-off decay rate 604 indicates the decay 722 of data stored in the erase blocks 108 over a predetermined unit of time while the SSD is powered off.

The decay 722 is loss of data or an increase number of bits in error. When a device is powered off, the decay 722 is a form of charge loss. The decay 722 can also take place while the SSD is being used but continuous recycling will be re-writing the data and refreshing it. In this context, an amount of decay or increase in bit error rate while the SSD is powered off is referred to herein.

The performance, retention, and endurance of the memory devices 106 can be affected by the amount of time between writes/erases performed in the memory devices 106. For example, data can be written to one of the erase blocks 108 and that block is erased, and then a number of hours have elapsed before that block is written again versus using that block immediately again. The performance, retention, and endurance can be better on the block associated with the number of hours have elapsed before that block is written again or with a longer dwell time. Therefore, the ratio of how fast and how often the erase blocks 108 are used or written can indicate how much the erase blocks 108 are degraded.

Dwell is an amount of time between P/E cycles. One example is one of the erase blocks 108 is erased and not written to for tens (10s) of minutes. If the time between P/E cycles is short including tens (10s) of seconds or less, one of the erase blocks 108 can age faster and show less retention than another of the erase blocks 108 with longer dwell times.

The decay estimation module 610 can include a get host time/date module 724 to determine how long, in real time, the SSD or the memory sub-system 102 has been powered off. The get host time/date module 724 can get or receive an initial start-up time/date 726, which is a time of day, from the host system 112 of FIG. 1. With this method, the host system 112 can send the get host time/date module 724 in the SSD a message indicating a current time/date or the initial start-up time/date 726 whenever the host system 112 initially connects with the SSD.

The get host time/date module 724 can track a real wall-clock time 728, which is a time of day, using the initial start-up time/date 726 as the starting point. The get host time/date module 724 can also store the real wall-clock time 728 in a non-volatile memory just before or while the SSD is powering off. Upon or after the get host time/date module 724 has been powered on, the get host time/date module 724 can receive a new start-up time/date 730, which is a time of day, from the host system 112.

Using this scheme, the SSD can calculate the power-off time 602 that indicates how long, in real time, it has been powered off. The power-off time 602 can be determined based on a difference between the new start-up time/date 730 and the real wall-clock time 728 that has been stored before the SSD or the get host time/date module 724 in the memory controller 114 is powered off. The difference can be calculating by subtracting the real wall-clock time 728 from the new start-up time/date 730.

The power-off time 602 can be used to calculate the power-off decay rate 604. The power-off time 602 can be directly proportional to the power-off decay rate 604. For example, an increase in the power-off time 602 can directly cause an increase in the power-off decay rate 604.

The decay estimation module 610 can include a pull host time/date module 732 to determine how long, in real time, the SSD or the memory sub-system 102 has been powered off. The SSD or the pull host time/date module 732 can asynchronously pull or query the current time/date or the initial start-up time/date 726 from the host system 112.

The term "asynchronous" referred to herein is associated with either the host system 112 sends a time/date to the SSD without a request from the SSD or the SSD triggers the host system 112 to send a time/date to the SSD. For example, the SSD firmware can trigger by sending a request to the host system 112 to send a time/date to the SSD. The time/date is not a normal packet of data that is continuously transmitted. In this context, asynchronous refers to a function associated with a time/date that can be triggered at any time including right after power up, during running, or just before power down.

The pull host time/date module 732 can ask or query the host system 112 for the current time/date every time it powers up and use the scheme above as described for the get host time/date module 724 to determine the power-off time. The pull host time/date module 732 can determine the power-off time 602 based on the real wall-clock time 728 and the new start-up time/date 730. The pull host time/date module 732 can determine the real wall-clock time 728 using the initial start-up time/date 726 as the starting point and the new start-up time/date 730 upon or after the pull host time/date module 732 has been powered on.

The decay estimation module 610 can include a real-time clock module 734 to determine how long, in real time, the SSD or the memory sub-system 102 has been powered off. Similar to the two methods described above for the get host time/date module 724 and the pull host time/date module 732, the real-time clock module 734 can use a real-time clock 736 to track the real wall-clock time 728 to know how long the SSD has been powered off. However, the real-time clock 736 does not need to be on the host system 112. The SSD itself can be capable of having a self-powered and continuously powered real-time clock using a device that generates a real or current time of day.

The real-time clock module 734 can store the real wall-clock time 728 in a non-volatile memory just before or while the SSD is powering off. Upon or after the real-time clock module 734 has been powered on, the real-time clock module 734 can determine the new start-up time/date 730 using a current value of the real wall-clock time 728 from the real-time clock 736. The real-time clock module 734 can determine the power-off time 602 by subtracting the real-time clock 736 stored before it was powered off and the new start-up time/date 730.

It has been discovered that the SSD or the memory sub-system 102 provides improved reliability by estimating the power-off decay rate 604 in NAND flash data retention while the SSD is powered off. The power-off decay rate 604 allows the recycle module 612 to recycle data on the erase blocks 108 that need refresh thereby eliminating loss of the data.

It has also been discovered that the SSD) or the memory sub-system 102 that uses estimates of the power-off decay rate 604 that occurred while the SSD is powered off provides improved reliability. The power-off decay rate 604 allows the recycle module 612 to determine when to recycle for data retention. The power-off decay rate 604 used to determine when to recycle for data retention also improves performance because refresh all data upon powering up takes longer time for the SSD to boot.

It has further been discovered that the SSD or the memory sub-system 102 that estimates time decay provides improved reliability by analyzing the power-off decay rate 604 of data on the memory devices 106.

It has further been discovered that the SSD or the memory sub-system 102 that analyzes the decay of data on the memory devices 106 provides improved reliability by considering the oldest-written data or the oldest data 706. The improved reliability is provided by estimating the error rate 704 of the oldest data 706 in the erase blocks 108 at risk of data loss.

It has further been discovered that the SSD or the memory sub-system 102 that analyzes the decay of data on the memory devices 106 provides improved reliability by considering the most-recently-written data or the freshest data 710. The improved reliability is provided by estimating the error rate 704 of the freshest data 710 in the erase blocks 108 at risk of data loss.

It has further been discovered that the SSD or the memory sub-system 102 that analyzes the decay of data on the memory devices 106 provides improved reliability by considering the surrogate data 714 on a preconditioned surrogate page or the erase blocks 108. The improved reliability is provided by estimating the error rate 704 of the surrogate data 714 in portions of the memory devices 106 set aside as a measure of data retention for the memory sub-system 102.

It has further been discovered that a scheme to mix data-retention recycles with other drive operations if there is at-risk data at power up provides improved reliability. The scheme uses the recycle module 612 to adjust how quickly the SSD recycles for data retention based on how many data-retention recycles it has pending. The scheme is used for the recycle module 612 to perform relatively more data-retention recycles for the erase blocks 108 compared to the host writes 614 from the host system 112 to provide the improved reliability.

It has further been discovered that the threshold voltage change estimation module 716 for estimating the decay 722 to calculate the power-off decay rate 604 significantly reduces performance degradation. The performance degradation is significantly reduced by recycling the erase blocks 108 for data retention using the decay 722 based on a difference between the pre-power-down threshold voltage 718 and the post-power-up threshold voltage 720 and the constant (K) based on age and dwell of the memory devices 106 for determining the power-off decay rate 604.

It has further been discovered that the get host time/date module 724 for calculating the power-off time 602 for indicating how long the memory sub-system 102 has been powered off significantly reduces performance degradation. The performance degradation is significantly reduced by calculating the power-off decay rate 604 using the power-off time 602 based on a difference between the real wall-clock time 728 and the new start-up time/date 730 received by the get host time/date module 724 from the host system 112.

It has further been discovered that the pull host time/date module 732 for calculating the power-off time 602 for indicating how long the memory sub-system 102 has been powered off significantly reduces performance degradation. The performance degradation is significantly reduced by calculating the power-off decay rate 604 using the power-off time 602 based on a difference between the real wall-clock time 728 and the new start-up time/date 730 by the pull host time/date module 732 asynchronously querying the host system 112.

It has further been discovered that the real-time clock module 734 for calculating the power-off time 602 for indicating how long the memory sub-system 102 has been powered off significantly reduces performance degradation. The performance degradation is significantly reduced by calculating the power-off decay rate 604 using the power-off time 602 based on the real wall-clock time 728 from the real-time clock 736 self-powered and continuously powered in the memory sub-system 102.

It has further been discovered that the decay estimation module 610 selecting the representative samples of the erase blocks 108 to examine rather than examining every one of the erase blocks 108 provides improved performance when the SSD boots up. The improved performance is provided when the representative samples are in a range of one to four out of 4,096 of the erase blocks 108 per flash die or one of the memory devices 106.

Functions or operations of the memory controller 114 of FIG. 1 as described above can be implemented in hardware, software, or a combination thereof. The memory controller 114 can be implemented with the control unit 202 of FIG. 2, the storage unit 204 of FIG. 2, the memory interface unit 206 of FIG. 2, the host interface unit 208 of FIG. 2, or a combination thereof.

For example, the oldest data error estimation module 702 can be implemented with the control unit 202 to estimate the error rate 704 of the oldest data 706 in the erase blocks 108 at risk of data loss. Also for example, the freshest data error estimation module 708 can be implemented with the control unit 202 to estimate the error rate 704 of the freshest data 710 in the erase blocks 108 at risk of data loss.

For example, the surrogate data error estimation module 712 can be implemented with the control unit 202 to estimate the error rate 704 of the surrogate data 714 in the erase blocks 108 at risk of data loss. Also for example, the threshold voltage change estimation module 716 can be implemented with the control unit 202 to estimate the decay 722 based on a difference between the pre-power-down threshold voltage 718 and the post-power-up threshold voltage 720 for determining the power-off decay rate 604.

For example, the get host time/date module 724 can be implemented with the control unit 202 to calculate the power-off time 602 based on a difference between the real wall-clock time 728 and the new start-up time/date 730 received by the get host time/date module 724 from the host system 112. Also for example, the pull host time/date module 732 can be implemented with the control unit 202 to calculate the power-off time 602 based on a difference between the real wall-clock time 728 and the new start-up time/date 730 by the pull host time/date module 732 asynchronously querying the host system 112, Further, for example, the real-time clock module 734 can be implemented with the control unit 202 to calculate the power-off time 602 based on the real wall-clock time 728 from the real-time clock 736 self-powered in the memory sub-system 102.

The oldest data error estimation module 702 can be coupled to the power-up module 608 and the freshest data error estimation module 708. The freshest data error estimation module 708 can be coupled to the surrogate data error estimation module 712. The surrogate data error estimation module 712 can be coupled to the threshold voltage change estimation module 716. The threshold voltage change estimation module 716 can be coupled to the get host time/date module 724. The get host time/date module 724 can be coupled to the pull host time/date module 732. The pull host time/date module 732 can be coupled to the real-time clock module 734.

The storage control system 100 of FIG. 1 is described with module functions or order as an example. The modules can be partitioned differently. For example, the get host time/date module 724 and the pull host time/date module 732 can be combined. Each of the modules can operate individually and independently of the other modules.

Furthermore, data generated in one module can be used by another module without being directly coupled to each other. Yet further, the oldest data error estimation module 702, the freshest data error estimation module 708, the surrogate data error estimation module 712, the threshold voltage change estimation module 716, the get host time/date module 724, the pull host time/date module 732, and the real-time clock module 734 can be implemented as hardware accelerators (not shown) within the control unit 202 or can be implemented as hardware accelerators (not shown) in the memory controller 114 or outside of the memory controller 114.

The physical transformation of estimating the power-off decay rate 604 upon the memory sub-system 102 powered up for indicating how much data in the memory sub-system 102 has decayed while the memory sub-system 102 has been powered down results in movement in the physical world, such as people using the memory sub-system 102 based on the operation of the storage control system 100. As the movement in the physical world occurs, the movement itself creates additional information that is converted back in to powering off the memory sub-system 102 and recycling the erase blocks 108 for data retention based on the power-off decay rate 604 for the continued operation of the storage control system 100 and to continue the movement in the physical world.

Figure 8:
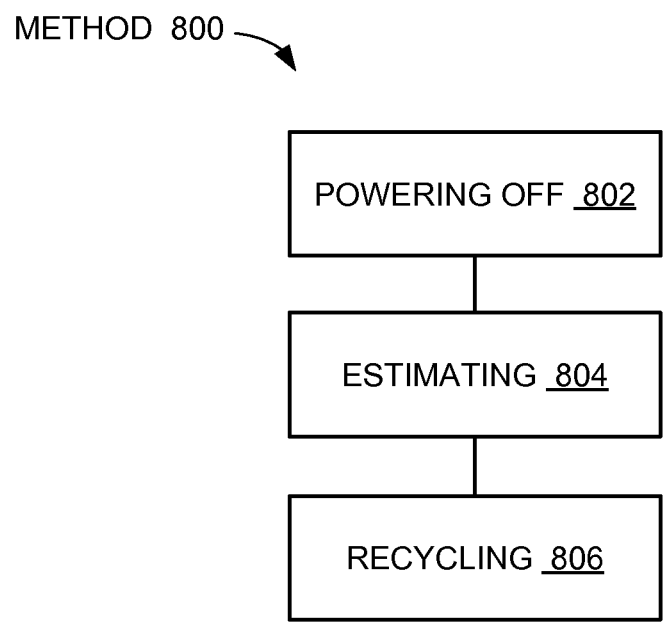
FIG. 8 is a flow chart of a method of operation of a storage control system in a further embodiment of the present invention.

Referring now to FIG. 8, therein is shown a flow chart of a method 800 of operation of a storage control system in a further embodiment of the present invention. The method 800 includes: powering off a memory sub-system in a block 802; estimating a power-off decay rate upon the memory sub-system powered up, the power-off decay rate is for indicating how much data in the memory sub-system has decayed while the memory sub-system has been powered down in a block 804; and recycling an erase block for data retention based on the power-off decay rate in a block 806.

Thus, it has been discovered that the storage control system of the present invention furnishes important and heretofore unknown and unavailable solutions, capabilities, and functional aspects for a storage control system with power-off time estimation mechanism. The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a storage control system comprising:
   powering off a memory sub-system;
   estimating power-off decay in respective blocks of a set of blocks of the memory sub-system upon the memory sub-system powering up, wherein the estimated power-off decay for a particular block is a numerical value indicating how much data in the particular block of the memory sub-system has decayed while the memory sub-system has been powered down, and the estimated power-off decay for the particular block is calculated as a function of a difference between a pre-power-down threshold voltage and a post-power-up threshold voltage; and
   identifying blocks in the memory sub-system for which the estimated power-off decay has reached a threshold and recycling at least the identified blocks in the memory sub-system for data retention;
   wherein estimating power-off decay includes calculating a power-off time for indicating how long the memory sub-system has been powered off and estimating the power-off decay as a function of the power-off time.

2. The method as claimed in claim 1, wherein estimating includes:
   in accordance with an identification of oldest data in the set of blocks, identifying an age of the oldest data in the set of blocks;
   estimating data retention of the oldest data in the set of blocks based on the identified age of the oldest data in the set of blocks, the oldest data comprising data least recently written to the set of blocks;
   determining, based on the estimated data retention of the oldest data, that the oldest data is at risk of data loss;
   in accordance with determining that the oldest data is at risk of data loss, flagging the oldest data for data retention recycling; and
   repeating the estimating, determining, and flagging with respect to a plurality of additional erase blocks in the memory sub-system, in an order corresponding to oldest-to-freshest data stored in the memory sub-system, until identifying an erase block that is not at risk of data loss.

3. The method as claimed in claim 1, wherein estimating includes:
   in accordance with an identification of freshest data in the set of blocks, identifying an age of the freshest data in the set of blocks;
   estimating data retention of freshest data in the set of blocks based on the identified age of the freshest data in the set of blocks, the freshest data comprising data most recently written to the set of blocks; and using the data retention of the freshest data to estimate data retention of other erase blocks.

4. The method as claimed in claim 1, wherein estimating includes: estimating an error rate of surrogate data as a measure of data retention for the memory sub-system, wherein the surrogate data is stored in a portion of a memory device set aside for measuring data retention.

5. The method as claimed in claim 1, wherein estimating the power-off decay comprises estimating the power-off decay as a function of time and temperature.

6. The method as claimed in claim 1, wherein estimating the power-off decay includes obtaining a power-up date and time by querying a host system and calculating a power-off time for indicating how long the memory sub-system has been powered off, the power-off time based on the obtained power-up date and time.

7. The method as claimed in claim 1, wherein estimating the power-off decay includes obtaining a power-up date and time by querying a real-time clock self-powered in the memory sub-system and calculating a power-off time for indicating how long the memory sub-system has been powered off, the power-off time based on the obtained power-up date and time.

8. The method as claimed in claim 1, wherein the recycling includes accelerating movement of the identified blocks through a write queue.

9. A storage control system comprising:
a power-down module configured to power off a memory sub-system;
a decay estimation module, coupled to the power-down module, configured to estimate power-off decay in respective blocks of a set of blocks of the memory sub-system upon the memory sub-system powering up, wherein the estimated power-off decay for a particular block is a numerical value indicating how much data in the particular block of the memory sub-system has decayed while the memory sub-system has been powered down, and the estimated power-off decay for the particular block is calculated as a function of a difference between a pre-power-down threshold voltage and a post-power-up threshold voltage; and
a recycle module, coupled to the decay estimation module, configured to identify blocks in the memory sub-system for which the estimated power-off decay has reached a threshold and recycling at least the identified blocks in the memory sub-system for data retention;
wherein the decay estimation module is configured to calculate a power-off time for indicating how long the memory sub-system has been powered off and estimating the power-off decay as a function of the power-off time.

10. The system as claimed in claim 9, wherein the decay estimation module is for:

identifying an age of the oldest data in the set of blocks in accordance with an identification of oldest data in the set of blocks;

estimating data retention of the oldest data in the set of blocks based on the identified age of the oldest data in the set of blocks, the oldest data comprising data least recently written to the set of blocks;

determining, based on the estimated data retention of the oldest data, that the oldest data is at risk of data loss;

in accordance with determining that the oldest data is at risk of data loss, flagging the oldest data for data retention recycling; and repeating the estimating, determining, and flagging with respect to a plurality of additional erase blocks in the memory sub-system, in an order corresponding to oldest-to-freshest data stored in the memory sub-system, until identifying an erase block that is not at risk of data loss.

11. The system as claimed in claim 9, wherein the decay estimation module is for:

identifying an age of the freshest data in the set of blocks in accordance with an identification of freshest data in the set of blocks;

estimating data retention of freshest data in the set of blocks based on the identified age of the freshest data in the set of blocks, the freshest data comprising data most recently written to the set of blocks; and using the data retention of the freshest data to estimate data retention of other erase blocks.

12. The system as claimed in claim 9, wherein the decay estimation module is for estimating an error rate of surrogate data as a measure of data retention for the memory sub-system, wherein the surrogate data is stored in a portion of a memory device set aside for measuring data retention.

13. The system as claimed in claim 9, wherein the decay estimation module is for estimating the power-off decay as a function of the power-off time and temperature.

14. The system as claimed in claim 13, wherein the decay estimation module is for obtaining a power-up date and time by querying a host system and calculating the power-off time for indicating how long the memory sub-system has been powered off, the power-off time based on the obtained power-up date and time.

15. The system as claimed in claim 13, wherein the decay estimation module is for obtaining a power-up date and time by querying a real-time clock self-powered in the memory sub-system and calculating the power-off time for indicating how long the memory sub-system has been powered off, the power-off time based on the obtained power-up date and time.

16. The system as claimed in claim 9, wherein the recycle module is for accelerating movement of the identified blocks through a write queue.

* * * * *